(12) United States Patent
Kawate et al.

(10) Patent No.: US 7,888,604 B2
(45) Date of Patent: *Feb. 15, 2011

(54) CONNECTION METHOD OF A FLEXIBLE PRINTED CIRCUIT BOARD WITH TWO PRINTED CIRCUIT BOARDS, AND ELECTRIC OR ELECTRONIC COMPONENT WITH PARTS CONNECTED BY THE CONNECTION METHOD

(75) Inventors: Kohichiro Kawate, Tokyo (JP); Andrew C. Lottes, Austin, TX (US); James G. Vana, Jr., Austin, TX (US); Barbara L. Birrell, Austin, TX (US); Alexander W. Barr, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 215 days.

This patent is subject to a terminal disclaimer.

(21) Appl. No.: 11/910,685

(22) PCT Filed: Apr. 11, 2006

(86) PCT No.: PCT/US2006/013273

§ 371 (c)(1),
(2), (4) Date: Oct. 4, 2007

(87) PCT Pub. No.: WO2006/110634

PCT Pub. Date: Oct. 19, 2006

(65) Prior Publication Data

US 2008/0171182 A1    Jul. 17, 2008

Related U.S. Application Data

(60) Provisional application No. 60/670,140, filed on Apr. 11, 2005.

(51) Int. Cl.
*H05K 1/00*    (2006.01)
*B32B 7/12*    (2006.01)

(52) U.S. Cl. .................. 174/255; 174/254; 174/261; 428/344; 428/355 EP

(58) Field of Classification Search ............... 428/209, 428/344, 355 EP; 174/255, 254, 261
See application file for complete search history.

(56) References Cited

U.S. PATENT DOCUMENTS

| | | | |
|---|---|---|---|
| 4,568,592 A * | 2/1986 | Kawaguchi et al. | ........ 428/107 |
| 4,606,962 A | 8/1986 | Reylek et al. | |
| 4,740,657 A | 4/1988 | Tsukagoshi et al. | |
| 5,002,818 A | 3/1991 | Licari | |
| 5,330,684 A | 7/1994 | Emori et al. | |
| 5,428,190 A * | 6/1995 | Stopperan | ........ 174/261 |
| 5,457,149 A | 10/1995 | Hall et al. | |
| 5,672,400 A | 9/1997 | Hansen et al. | |

(Continued)

FOREIGN PATENT DOCUMENTS

EP    1 277 819 A1    1/2003

(Continued)

*Primary Examiner*—Cathy Lam
(74) *Attorney, Agent, or Firm*—Melanie S. Gover; Bradford B. Wright

(57) ABSTRACT

Provided is a method of connecting conductive traces on one substrate to conductive traces on another substrate using an adhesive containing conductive particles and the resulting article.

13 Claims, 6 Drawing Sheets

U.S. PATENT DOCUMENTS

| | | |
|---|---|---|
| 5,764,497 A | 6/1998 | Mizumo |
| 5,840,215 A | 11/1998 | Iyer et al. |
| 6,039,896 A | 3/2000 | Miyamoto |
| 6,328,844 B1 | 12/2001 | Watanabe et al. |
| 6,338,195 B1 | 1/2002 | Tsukagoshi et al. |
| 6,564,450 B2 * | 5/2003 | Engbring et al. ............. 29/830 |
| 6,657,031 B1 | 12/2003 | Crane et al. |
| 6,703,566 B1 | 3/2004 | Shiraishi |
| 6,833,180 B1 | 12/2004 | Kodemura |
| 6,841,022 B2 | 1/2005 | Tsukagoshi et al. |
| 2003/0029559 A1 | 2/2003 | Yamada et al. |
| 2004/0162120 A1 | 8/2004 | Kurono |

FOREIGN PATENT DOCUMENTS

| | | |
|---|---|---|
| JP | 54-111671 A | 9/1979 |
| JP | 2-288019 A | 11/1990 |
| JP | 4-272607 A | 9/1992 |
| JP | 2002-146319 | 5/2002 |
| WO | WO 2004/000966 | 12/2003 |

* cited by examiner

CONNECTION METHOD OF A FLEXIBLE PRINTED CIRCUIT BOARD WITH TWO PRINTED CIRCUIT BOARDS, AND ELECTRIC OR ELECTRONIC COMPONENT WITH PARTS CONNECTED BY THE CONNECTION METHOD

CROSS REFERENCE TO RELATED APPLICATIONS

This application is a national stage filing under 35 U.S.C. 371 of PCT/US2006/013273, filed Apr. 11, 2006, which claims priority to U.S. Provisional Application No. 60/670,140, filed Apr. 11, 2005, the disclosure of which is incorporated by reference in their entirety herein.

FIELD

The present invention relates to a method of connecting conductive traces that are formed on a substrate.

BACKGROUND

In an electric or electronic component, a multi-conductor in which a plurality of conductors, or traces, are arranged on a member is connected to other multi-conductor. For example, when a circuit board having various electronic parts packaged thereon is connected to another circuit board, multiple conductive traces are formed on the one and the other circuit boards, respectively, and two end portions of the multi-conductors are respectively connected to each other to connect the two circuit boards.

Various connection methods such as soldering, compression connection, connection using a connector, or the like, are considered for connection of such a multi-conductor. However, in recent years, as the main body of electric and electronic apparatus has become thinner and smaller, width and separation of conductors have become increasingly small, and existing connection means are not optimal.

SUMMARY

One aspect of the invention provides an article comprising a flexible substrate having at least one conductive trace on its surface extending from a first end to a second end of the substrate, wherein said at least one conductive trace is configured to form an electrical connection between a first circuit to be connected at the first end of the substrate and a second circuit to be connected at the second end of the substrate, and a heat-curable adhesive on the first and second ends of the substrate wherein the adhesive comprises conductive particles.

Another aspect of the invention provides a method comprising providing a first flexible substrate having at least one conductive trace on its surface; disposing on a portion of the at least one trace a heat-curable adhesive composition wherein the adhesive composition comprises conductive particles; providing a second substrate having at least one trace; aligning corresponding traces on the first and second substrates; and bonding the first and second substrates under application of heat and pressure to bring the corresponding traces into electrical contact and flow and cure the adhesive around the traces, at a temperature lower than the melting point of the conductive traces.

Other features and advantages of the invention will be apparent from the following drawings, detailed description, and claims.

BRIEF DESCRIPTION OF THE DRAWINGS

FIG. 5 is a view showing a flexible multi-conductor having adhesive laminated thereon, in which:

Figure 6:
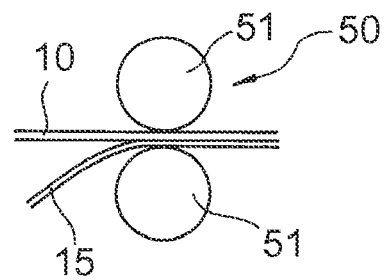
Figure 7:
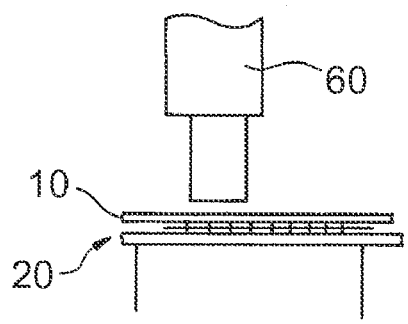
Figure 8:
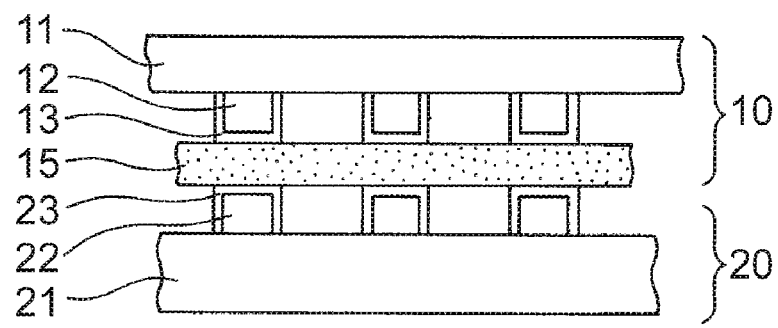
Figure 9:
Figure 10:
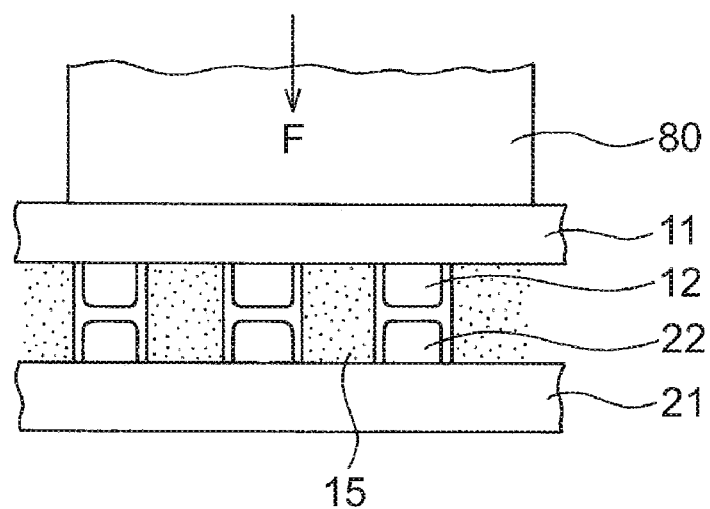
Figure 11:
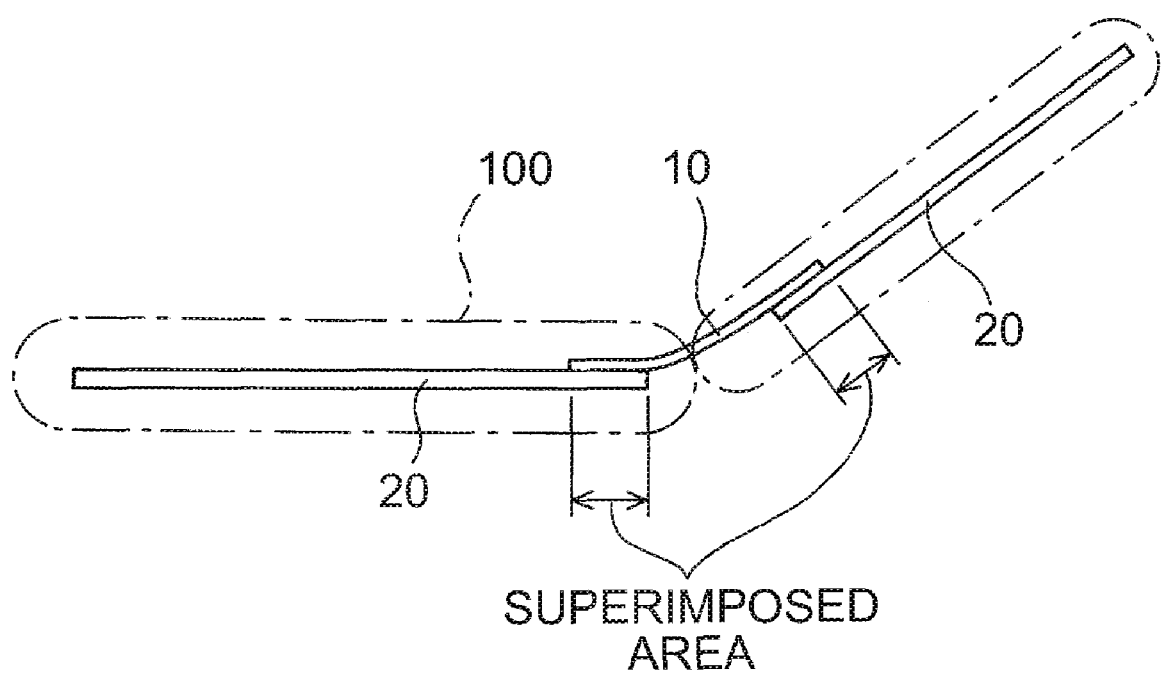

(A) is a view as seen from axial direction of the conductor, and (B) is a view as seen from the direction perpendicular to the axis of the conductor;

FIG. 6 is a view showing a roller laminator;

FIG. 7 is a view useful for explaining procedure of position alignment using a microscope;

FIG. 8 is a view showing a flexible multi-conductor and a rigid multi-conductor aligned in position;

FIG. 9 is a view showing a soldering iron for temporary bonding;

FIG. 10 is a view useful for explaining full bonding;

FIG. 11 is a view showing two rigid multi-conductors interconnected with a flexible multi-conductor in a mobile telephone set.

DETAILED DISCLOSURE

At least one aspect of the present invention provides a connection method which is capable of reliably connecting narrow and miniaturized conductive traces, and which permits repair work to be carried out easily.

At least one aspect of the present invention, in association with above-described connection method, provides an electric or electronic device connected by this connection method.

The substrates of the present invention may have single traces, but typically will have a plurality of conductive traces, or conductors, arranged on its surface, and are generally referred to as "multi-conductors." Multi-conductors include printed circuit boards in general (rigid circuit board, flexible circuit board) and circuits provided directly on a surface of a device. A multi-conductor may also be a "jumper circuit," which can connect two other multi-conductors, such as a device and a board.

At least one aspect of the method of this invention provides superimposed areas of a pair of conductive traces. The conductive traces are connected by metallic bonding or by mechanical or physical contact between metals, and surrounding portions are connected by heat-curable adhesive, so that a very strong connection can be realized. By using a heat-curable adhesive, such as a heat curable composition containing caprolactone modified epoxy resin, disconnection and re-connection for repair work can be accomplished easily. As shown in FIG. 11, the superimposed area is the area where a pair of multi-conductors 10, 20 are overlapped with each other.

Aspects of the present invention will now be described in detail with reference to appended drawings showing embodiments thereof.

There are various multi-conductors formed by arranging a plurality of conductors on a substrate member, such as, for example, rigid multi-conductors formed by arranging conductors directly on a rigid substrate for packaging electronic parts, flexible multi-conductors formed by arranging conductors on a flexible film, and the like. Flexible multi-conductors include so-called flexible boards. The present invention can be used for various connections such as connection of rigid multi-conductors, connection of flexible multi-conductors, or connection of a rigid multi-conductor and a flexible multi-conductor.

The conductors on a substrate, particularly a flexible substrate may be digitated, i.e., the substrate between the end portions of the individual conductors may be slit or otherwise separated, such that the individual conductors on one multi-conductor have additional flexibility to conform to the conductors on a second multi-conductor when they are joined together. This may be particularly suitable for an embodiment in which one multi-conductor is rigid and one is flexible. If the traces on the flexible multi-conductor are digitated, they will be able to conform to the traces on the rigid multi-conductor, which will allow for a better connection between the individual superimposed traces.

The connection of multi-conductors will be described with respect to connection of a rigid multi-conductor and a flexible multi-conductor as an example. However, as previously stated, the connection method is suitable for any combination of flexible and rigid substrates having trace conductors. The conductors on the substrates to be connected may be made of the same, or different, material.

Figure 1:
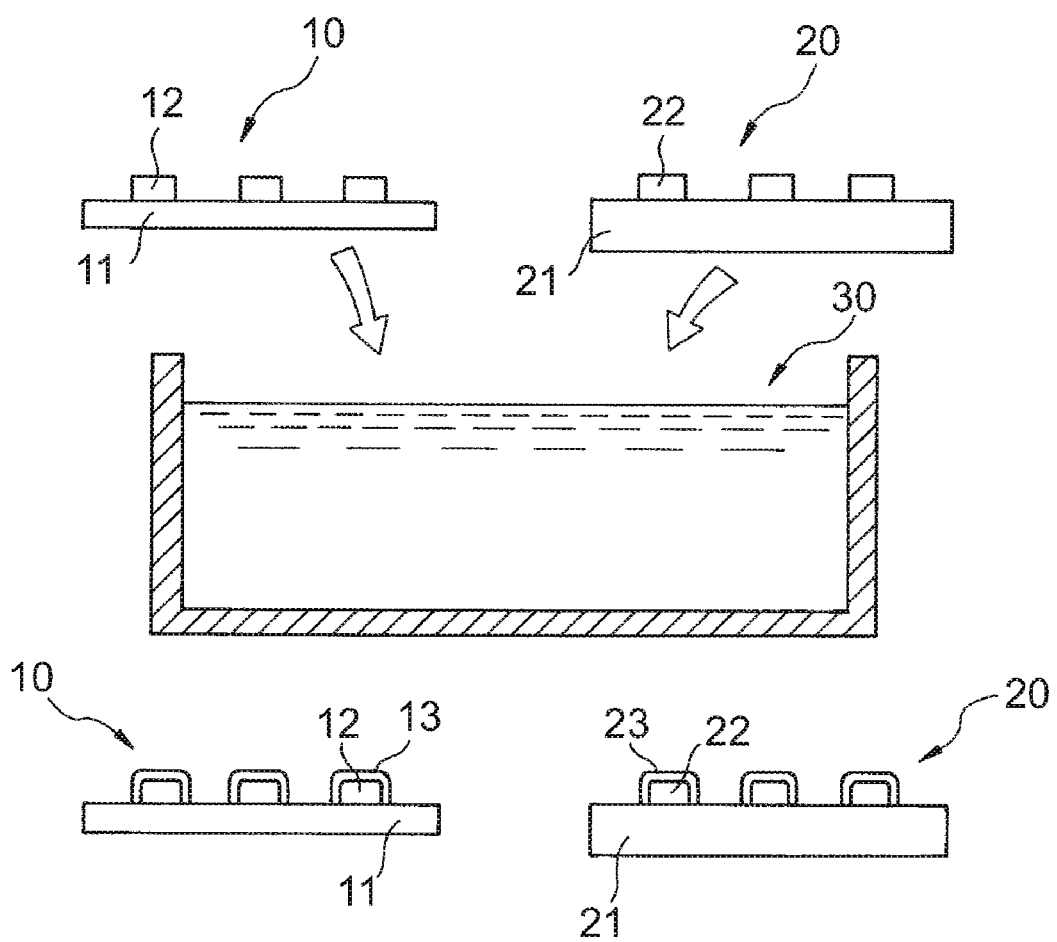
FIG. 1 is a view useful for explaining plating of non-corrosive metal performed on conductors of a flexible multi-conductor and a rigid multi-conductor.

A flexible multi-conductor 10 and a rigid multi-conductor 20 are shown in FIG. 1. The flexible multi-conductor 10 is formed of a plurality of conductor 12 made of a conductive material, such as a copper alloy, arranged at a specified spacing on a flexible resin film 11, and the rigid multi-conductor 20 is formed of a plurality of conductor 22 made of a metal, such as a copper alloy, arranged at a specified spacing on a rigid resin substrate 21. Placement of the above-mentioned conductors 12, 22 is carried out, for example, by a photolithographic method, or the like.

A non-corrosive metal layer may then be formed on these conductors as the outermost layer of the conductors. The height of the conductors 12, 22 is about 5 to about 250 μm, and width of conductor 12 and of conductor 22 are made equal to each other and is a few tens μm to about 100 μm, and the spacing is also a few tens μm to about 100 μm. These are shown in a somewhat exaggerated manner in FIG. 1.

The aforementioned non-corrosive metal layer is usually formed by a plating method, although formation is not limited to this method. To form the non-corrosive layer, a flexible multi-conductor 10 and/or a rigid multi-conductor 20 can be immersed in a non-corrosive metal plating bath 30 shown in the center in FIG. 1, and plated non-corrosive metal layers 13, 23 are respectively formed on the surface of the conductors 12, 22. Thickness of the plated layer 13, 23 is about 0.1 to about 0.5 μm.

At the bottom of FIG. 1, a flexible multi-conductor 10 and a rigid multi-conductor 20 with plated non-corrosive metal layer 13, 23, respectively, adhered thereon are shown.

Although an example of so-called dip-brazing method has been described above, other plating method, for example, electrolytic plating or electroless plating, may be used.

As the non-corrosive metal for constituting the outermost layer of the conductor, suitable metals include gold, silver, palladium, platinum, tin, and alloys thereof may be used. Use of these materials permits solid phase joints such as those formed by cold welding, friction welding, and diffusion bonding to be realized. However, since in the connection method of the present invention, an adhesive surrounds and fixes the metal conductors, a solid phase joint is not required and contact of the conductors may suffice to form a connection. Nevertheless, to secure a stable connection, a solid phase joint may be formed to reliably connect conductors to each other. In friction bonding, ultrasonic vibration may be applied to promote a solid phase joint.

Figure 2:
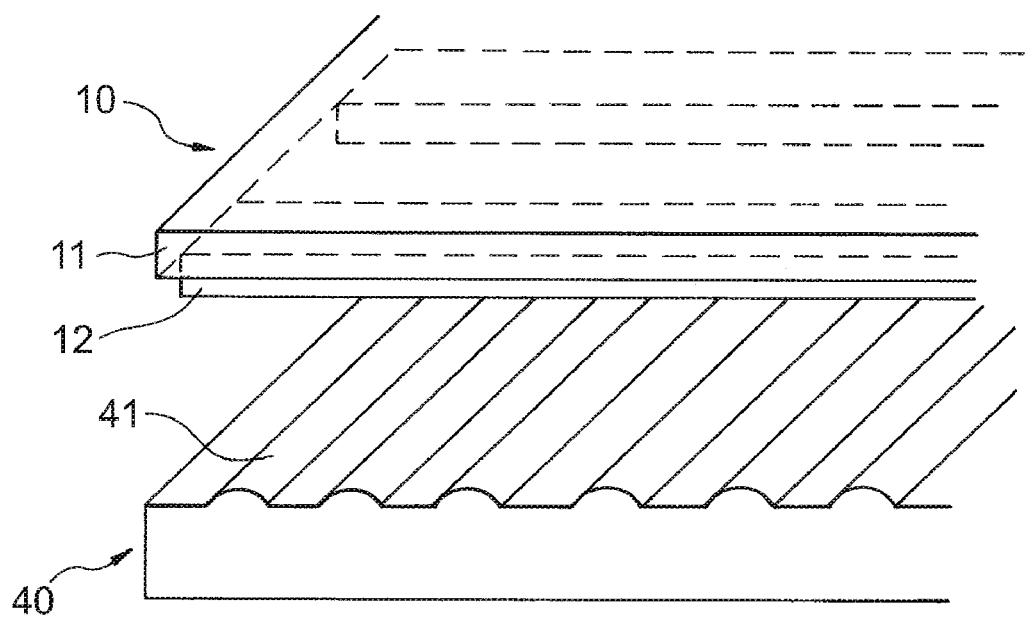
FIG. 2 is a view useful for explaining formation of roughness on conductors of a flexible multi-conductor using a die.
Figure 3:
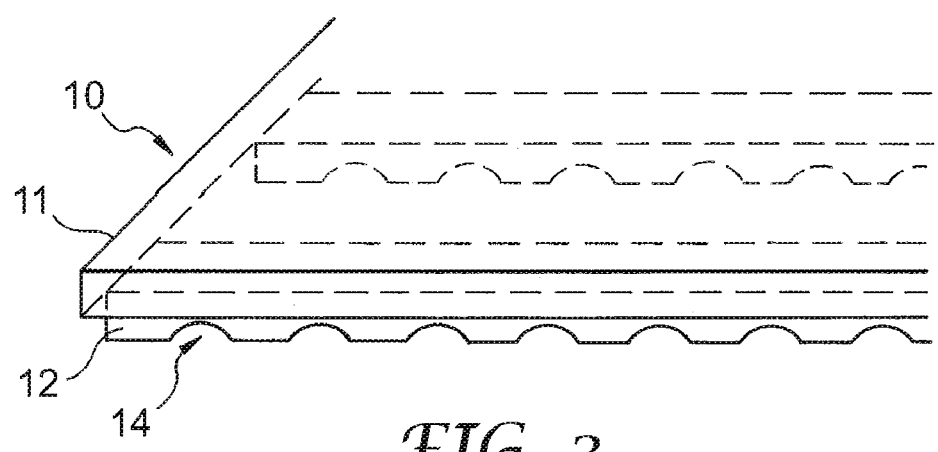
FIG. 3 is a view useful for explaining conductors of a flexible multi-conductor having roughness formed thereon.

Then, preferably, an embossed, or non-flat, portion 14 is formed on the conductor 12 of the flexible multi-conductor 10. This is done for assuring the connection of the conductor 12 of the flexible multi-conductor 10 and the conductor 22 of the rigid multi-conductor 20 to be performed later. FIG. 2 is a view useful for explaining the formation of non-flat portion 14 on the flexible multi-conductor 10. The flexible multi-conductor 10 in a state as shown in the bottom of FIG. 1 is pressed against a mould 40 in which protrusions 41 in the shape of semi-circular cylinder are formed side by side. FIG. 3 is a view showing the flexible multi-conductor 10 having non-flat portion 14 formed as described above. The protrusions may be any suitable shape such as pyramidal, rectangular, round, square, etc. The non-flat portions can help to provide good metal-to-metal contact because they allow the adhesive to be more easily displaced from between the metal contact points.

Figure 4:
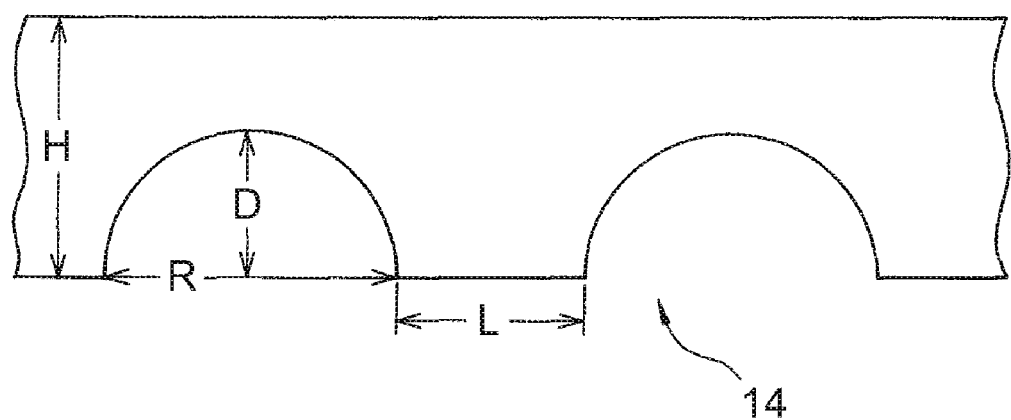
FIG. 4 is a view useful for explaining dimensions of the roughness formed on the conductors.

The size of the non-flat portion 14 will depend on such factors as the size of the height, depth, and width of the conductive traces, the planned use for the multi-conductors, etc. A preferable size of the non-flat portion 14 will be described next with reference to FIG. 4.

Width R of the non-flat portion 14 is preferably equal to the conductor height H×(about 0.5 to about 10), and if H=20 μm, R is about 10 to about 200 μm.

Depth D of the concavity of the non-flat portion 14 is preferably equal to the conductor height H×(about 0.2 to about 0.8), and if H=20 μm, D is 5 about 100 μm.

Spacing L between concavities of the non-flat portion 14 is preferably equal to the conductor height H×(0.5 to about 10), and if H=20 μm, L is about 10 to about 200 μm.

The optional non-corrosive metal (which is not shown in FIGS. 2, 3, and 4) may be added at this time.

Then, an adhesive is attached to at least one of the multi-conductors in the area in which the conductors to be superimposed are contained. Several additional characteristics are desirable for the adhesive used in the present invention. These characteristics are considered below.

First, the flexible multi-conductor 10 and the rigid multi-conductor 20 are aligned in position so that the corresponding conductors are properly superimposed. If the adhesive exhibits tackiness, it may be difficult and time-consuming to separate the two multi-conductors to correct alignment error. Therefore, the adhesive preferably exhibits little or no tackiness during position alignment, that is, at room temperature.

Then, it may be preferable to temporarily bond the flexible multi-conductor 10 and the rigid multi-conductor 20 as aligned in position. Therefore, the adhesive preferably exhibits tackiness (but does not fully cure) after being heated for a short period.

Next, hot press-bonding is performed. That is, while being heated, the flexible multi-conductor 10 and the rigid multi-conductor 20 are pressed together so that metal layers on the conductors contact each other. In some embodiments, the metals preferably form solid phase junctions between them. If bubbles are generated by the hot press-bonding, the metal contact may be impaired or destroyed, or short circuiting may take place due to condensation of water in the bubbles under high humidity. Thus, it is desirable that the adhesive composition does not generate bubbles when heated.

On the other hand, in the initial state of the hot press-bonding, that is, at relatively low temperature, it is desired that the conductors projecting from the substrate 21 or the film 11 can penetrate through the layer of the adhesive composition so that conductors may come into contact with each other.

In addition, if the connection between the flexible multi-conductor 10 and the rigid multi-conductor 20 happens to fail, the adhesive composition preferably permits this connection to be disconnected easily, and after repair work such as replacement of either the multi-conductor 10 or the multi-conductor 20 has been completed, permits the connection to be restored. Therefore, the adhesive composition is preferably permits the connection to be easily disconnected and easily restored again. In other words, the adhesive is removable and reworkable. In this context, "removable" means the adhesive can be heated and softened such that the bonded articles can be separated and "reworkable" means the adhesive can be heated and softened after the articles are separated such that the previously bonded articles can be rebonded, or bonded to different articles.

An adhesive composition that satisfies above-described requirements is the heat-curable adhesive of the present invention. At least one embodiment of the heat-curable adhesive of the present invention is lightly cross-linked after being cured, which allows it to soften when subsequently being heated after it is cured. At least one embodiment of the heat-curable adhesive composition contains caprolactone modified epoxy resin.

At least one embodiment of the heat-curable adhesive of the present invention has a crystalline phase. For example, the crystalline phase may contain caprolactone modified epoxy resin (hereinafter referred to as "modified epoxy resin") as a main component. The modified epoxy resin imparts suitable flexibility to the heat-curable adhesive composition, and thus can improve visco-elastic properties of the heat curable adhesive. As a result, the heat curable adhesive exhibits cohesion even before hardening, and develops adhesive capability upon heating. Like ordinary epoxy resins, the modified epoxy resin forms, upon heating, a hardened product having 3-dimensional network structure, and thereby imparts cohesive strength to the heat curable adhesive composition.

In accordance with an aspect of the present invention, such a modified epoxy resin has epoxy equivalent of, typically about 100 to about 9,000, preferably about 200 to about 5,000, and more preferably about 500 to about 3,000. Modified epoxy resin having such an epoxy equivalent is commercially available, for example, from Daicel Chemical Industries Co. under the tradename of PLACCEL G series.

The heat-curable adhesive composition of the present invention preferably contains a tack-reducing agent. A suitable tack-reducing agent is melamine/isocyanuric acid adduct (herein after referred to also as "melamine/isocyanuric acid complex"), in combination with the above-described modified epoxy resin. Useful melamine/isocyanuric acid complex is commercially available, for example, from Nissan Chemical Industries Co. under the tradename of MC-600, and is effective for strengthening of the heat-curable adhesive composition, reduction of tackiness of the heat-curable adhesive composition before heat curing due to development of thixotropy, and suppression of moisture absorption and fluidity of the heat-curable adhesive composition. In view of prevention of embrittlement after hardening without impairing the effects as described above, the heat-curable adhesive composition may contain melamine/isocyanuric acid complex in an amount of typically in the range of about 1 to about 200 parts by weight, preferably in the range of about 2 to about 100 parts by weight, and more preferably in the range of about 3 to about 50 parts by weight, relative to 100 parts by weight of modified epoxy resin.

The heat-curable adhesive composition may further contain thermoplastic resin for improvement of repair performance. A suitable thermoplastic resin is phenoxy resin. Phenoxy resin is a thermoplastic resin with chain or linear structure of relatively high molecular weight, and consists of epichlorohidorin and bisphenol A. Phenoxy resin has excellent workability, and can be advantageously used to form a heat-curable adhesive composition of desired shape. In accordance with at least one aspect of the present invention, phenoxy resin may be contained in the heat-curable adhesive composition in an amount, relative to 100 parts by weight of the modified epoxy resin, typically in the range of about 10 to about 300 parts by weight, preferably in the range of about 20 to about 200 parts by weight. This is because, in this range, phenoxy resin can be effectively co-dissolved with the aforesaid modified epoxy resin. In this manner, bleeding of the modified epoxy resin from the heat-curable adhesive composition can be effectively prevented. Phenoxy resin entangles with above-described hardened product of the modified epoxy resin to increase ultimate cohesive strength and thermal resistance of the heat-curable adhesive composition. Further, good repair performance after connection can be obtained.

Further, the heat-curable adhesive composition may contain, in combination with or independently of the above-described phenoxy resin, a second epoxy resin (hereinafter referred to simply as "epoxy resin"), as required. This epoxy resin is not particularly limited as long as it does not depart from the scope of the invention, and for example, bisphenol A epoxy resin, bisphenol F epoxy resin, bisphenol A diglycidyl ether type epoxy resin, phenol novolac type epoxy resin, cresol novolac type epoxy resin, fluolene epoxy resin, glycidyl amine epoxy resin, aliphatic epoxy resin, brominated epoxy resin, fluorinated epoxy resin, etc, may be used. These epoxy resins are, like the modified epoxy resin, cosoluble with phenoxy resin, and exhibit little bleeding from the heat-curable adhesive composition. Especially when the heat-curable adhesive composition contain preferably about 50 to about 200 parts by weight, and more preferably about 60 to about 140 parts by weight of the second epoxy resin relative to 100 parts by weight of the modified epoxy resin, thermal resistance can be advantageously improved.

In implementing the present invention, bisphenol A diglycidyl ether type epoxy resin (hereinafter also referred to as "diglycidyl ether type epoxy resin"), in particular, can be used as a preferable epoxy resin. This diglycidyl ether type epoxy resin is liquid, and can improve, for example, high temperature characteristics of the heat-curable adhesive composition. For example, by using the diglycidyl ether type epoxy resin, chemical resistance due to high temperature hardening and glass transition temperature can be improved. In addition, the range of application of curing agent can be broadened and condition for curing can be made relatively gentle. Such a diglycidyl ether type epoxy resin is commercially available, for example, from Dow Chemical (Japan) Co. under the tradename of D.E.R. 332.

A curing agent may be added to the heat-curable adhesive composition to facilitate the curing reaction of the modified epoxy resin and the second epoxy resin. Type and amount of the curing agent is not particularly limited as long as the desired effect can be obtained. But, in view of improvement of thermal resistance, the heat-curable adhesive composition may contain, relative to 100 parts by weight of the modified epoxy resin and the necessary second epoxy resin, typically about 1 to about 50 parts by weight, preferably about 2 to about 40 parts by weight, and more preferably about 5 to about 30 parts by weight, of a curing agent. Examples of useful curing agent include, but are not limited to, amine curing agent, acid anhydride, dicyanamide, cationic polymerization catalyst, imidazole compound, hydrazine compound, etc. In particular, dicyanamide can be mentioned as a promising curing agent from the viewpoint of thermal stability at room temperature. With respect to diglycidyl ether type epoxy resin, alicyclic polyamine, polyamide, amideamine and modification thereof may be preferably used.

About 25 to about 90 parts by weight of organic particles may be added to 100 parts by weight of the heat-curable adhesive composition to obtain a resin, which has suppressed foaming property and allows good penetration of conductors through the adhesive composition. Such a resin exhibits plastic flow characteristics. That is, when a stress exceeding the yield stress is applied, it flows plastically, but it deforms elastically in response to external force not greater than the yield stress. When protrusions of conductor are pressed against this resin with relatively high pressure, a resin possessing such property flows to permit the conductor to penetrate through it. However, when water vapor pressure resulting from water content of the substrate is applied on the resin upon heating, the resin flows and produces almost no bubbles.

The organic particles that my be added include particles of acrylic resins, styrene-butadiene resins, styrene-butadiene-acrylic resins, melamine resins, melamine-isocyanurate adduct, polyimides, silicone resins, polyether imides, polyether sulfones, polyesters, polycarbonates, polyether ether ketones, polybenzoimidazoles, polyallylates, liquid crystal polymers, olefin resins, ethylene-acrylic copolymer, and the particle size is not greater than about 0 µm, preferably not greater than about 5 µm.

Electrically conductive particles, including, for example, those described in U.S. Pat. Nos. 4,606,962 (Reylek et al.) and 4,740,657 (Tsukagoski et al.), which are incorporated by reference, may be added to the adhesive composition of the present invention. The conductive particles can be metal particles, aggregated metal particles, molten metal particles, or particles in which a metal has been coated on a polymer nucleus material. The conductive particles may be made of a single material, such as a metal (e.g., silver, gold, copper, nickel and the like, a metal oxide such as indium tin oxide or aluminum zinc oxide, or conductive non-metals such as carbon black or conductive polymers. Such particles may be made of more than one material, such as a solder surface layer and either a metallic or non-metallic core. The conductive particles may be spherical or non-spherical. Preferably, the diameter of the conductive particles is of such a size that does not cause short circuiting with the neighboring circuits. The range of particle diameters may typically be about 5 µm, about 4 µm, or about 2 µm on the lower end and about 30 µm, about 20 µm, or about 6 µm on the upper end, and generally should be less than the thickness of the adhesive layer. Conductive particles contained in adhesive compositions of the invention may be randomly dispersed therein or may be arranged in a uniform array of desired configuration.

Conductive particles may be added to the adhesive to form an anisotropic conductive film (ACF), which provides conductivity in the Z-axis direction. Conductive particles may also be added for other reasons such as to enhance thermal conductivity, to provide grounding, to provide EMI shielding, or to provide conductivity in all 3 dimensions of the adhesive; i.e., to provide an isotropically-conductive adhesive.

The amount of conductive particles in the adhesive may also vary depending on the desired function of the particles. If the conductive particles are added to form an ACF, an amount sufficient to establish electrical contact between opposing conductive elements, when adhered together by the adhesive, should be added. If the conductive particles are added for other purposes, a greater or lesser amount may be added. To economize the use of electrically conductive particles, the particles may be located only in segments of the adhesive film that are to contact individual electrical conductors. When solid metal or composite particles are used in the adhesive composition of the present invention, they are typically provided at concentrations ranging from about 1% to about 15% by volume, based on the total volume of the composition. The adhesive composition obtained as described above is attached to the surface of the flexible multi-conductor 10 and/or the rigid multi-conductor 20. The adhesive may be prepared as a dry film and be thermally laminated, or it may be coated in liquid form. The area covered by the attached adhesive need not be limited to the area of the conductors, and there is no problem even if the area extends to the surroundings of the conductors.

Figure 5:
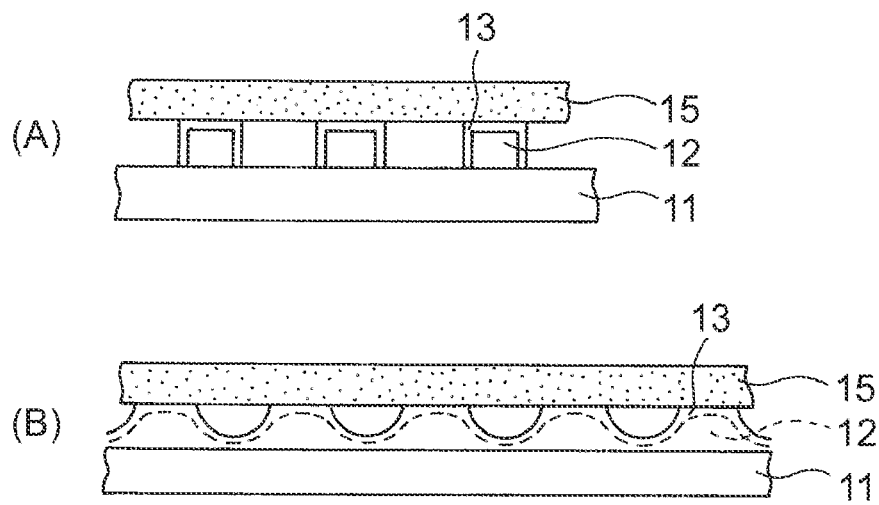

FIG. 5 is a view showing the flexible multi-conductor 10 having the adhesive in the form of dry film thermally laminated at about 80 to about 120° C. FIG. 5(A) is a view as seen from axial direction of the conductor 12, and FIG. 5(B) is a view as seen from the direction perpendicular to the axis of the conductor 12. Reference numeral 15 denotes the adhesive layer. Thickness of the adhesive layer 15 is about 0.2 to about 2.5 times the height of the conductor and is about 5 to about 200 µm, preferably about 10 to about 50 µm, and more preferably about 10 to about 20 µm.

FIG. 6 is a view showing a roller laminator 50 which thermally laminates the adhesive 15 in the form of dry film onto the flexible multi-conductor 10, and which comprises a pair of rollers 51 and unshown heating device.

As shown in FIG. 7, the flexible multi-conductor 10 having the adhesive attached thereto is aligned in position using a microscope 60. In this embodiment, the flexible multi-conductor 10 is moved, as shown in FIG. 8, with the adhesive layer 15 facing downwards on the rigid multi-conductor 20, and is aligned such that corresponding conductors of the conductor 12 of the flexible multi-conductor 10 and the conductor 22 of the rigid multi-conductor 20 are brought into the same position. This position alignment is performed at room temperature, and since the adhesive preferably exhibits little to no tackiness at room temperature, sticking of conductors does not occur and the position alignment can be performed smoothly.

After the position alignment has been completed, preferably, a minimum heating of, for example, about 120° C. to about 150° C. for about 1 second, is performed by a soldering iron 70 as shown in FIG. 9. Then, the adhesive exhibits tackiness and the flexible multi-conductor 10 and the rigid multi-conductor 20 that have been aligned in position are temporarily bonded to each other so that relative displacement no longer takes place.

The flexible multi-conductor 10 and the rigid multi-conductor 20 that have been temporarily bonded as described above are then press-bonded more permanently (full press-bonding). FIG. 10 is a view showing the result of full press-bonding after a bonder 80 is used to perform hot press-bonding. As shown, the metal layers of the flexible multi-conductor 10 and the rigid multi-conductor 20 come into contact with each other. As a result, the conductor 11 of the flexible multi-conductor 10 and the conductor 21 of the rigid multi-conductor 20 are strongly connected. Press bonding is performed under load, optionally with application of ultrasonic vibration to promote friction welding or the application of electric current. Condition of the heating is generally about 100 to about 250° C. for about 1 to about 30 seconds. If temperature is higher or heating time is longer, the multi-conductor 10 or 20 may be damaged, and if temperature is lower or heating time is shorter, effective connection may not be obtained. Pressing force is about $2 \times 10^2$ to about $10 \times 10^2$ kPa.

If conductive particles are added to the adhesive, at least a portion of them will reside between one or more conductors 11, 21 of the multi-conductors 10, 20. If a sufficient amount of conductive particles are added to the adhesive to form an anisotropically conductive adhesive, the particles will provide electrical connection between individual opposing conductors 11 and 21. Additionally, if such as anisotropic adhesive is used, the conductors 11, 21 need not have non-flat portions.

In the present invention, when failure such as deviation of position, etc. arises or when the connected multi-conductor 10 or 20 becomes defective, the connection can be easily released by heating at a relatively low temperature of 250° C. or lower. The disconnected multi-conductor 10 or 20 can be easily connected again by hot press-bonding under the conditions as described above.

Thus, it can be appreciated that aspects of the present invention may be used to mechanically bond a first substrate to a second substrate. More specifically, aspects may be used to make electrical connections between conductors on a first substrate and conductors on a second substrate by providing direct interconnection of the conductors on either individual substrate.

As specific illustrative examples, aspects of the invention may be used to help establish electrical interconnection between electrically conductive pads on a chip or a chip module and electrically conductive traces on a substrate, wherein the substrate may be a flex circuit (including a Smart Card body), a printed circuit board, indium tin oxide (ITO)-coated glass, or glass with other electrically conductive traces; or electrical interconnection between electrically conductive traces on a flex circuit and electrically conductive traces on a second flex circuit, a printed circuit board, ITO-coated glass, and/or glass with other electrically conductive traces; or electrical interconnection between electrically conductive traces on two printed circuit boards or between a printed circuit board and a ground plane. These kinds of electrical interconnections find use in such applications as portable electronics, computers, laptop computers, keyboards, touch screens, displays (both glass and plastic), cell phones, personal digital assistants (PDAs), pagers, Smart Cards, Radio Frequency Identification (RFID) Tags, Smart Labels, antennae for portable electronics, calculators, watches, radios, engine control units, and the like. FIG. 11 shows a component of the present invention being used in a mobile telephone set 100.

Other objects, features, and advantages of this invention are further illustrated by the following examples, but the particular materials and amounts thereof recited in these examples, as well as other conditions and details, should not be construed to unduly limit this invention.

EXAMPLES

Specific examples of connection of the flexible multi-conductor and the rigid multi-conductor and result of the performance test will be described below.

1. Connection of a Rigid Circuit Board (PCB) (Rigid Multi-Conductor) and a Flexible Printed Circuit Board (FPC) (Flexible Multi-Conductor).

PCB: substrate: glass cloth based epoxy resin printed board as defined in JIS C6484 (thickness 0.4 mm), height of conductors: gold/nickel/copper=0.3 µm/5 µm/18 µm, L/S (width of linear conductor/separation between linear conductors)=100 µm/100 µm, number of circuits (number of linear conductors): 50.

FPC: substrate: polyimide (KAPTON manufactured by DuPont Co.) (thickness 25 µm), height of conductors: gold/nickel/copper=0.3 µm/1.5 µm/18 µm, L/S (width of linear conductor/separation between linear conductors)=100 µm/100 µm, number of circuits (number of linear conductors): 50.

2. Protrusions are Formed on the Surface of FPC Circuit by Pressing to a Die.

Die: SKD-11 (as defined in JIS G4404), consisting of 8 linear concavities at pitch: 200 µm, and height: 30 µm Press: Press Under Load of 400 Kgf, with Linear Protrusions Perpendicular to FPC Circuit.

3. Preparation of the Adhesive Composition

Composition shown in Table 1 was mixed and prepared at room temperature, and coated on a silicone treated polyethylene terephthalate (PET) film, and dried for 30 minutes in an oven at 100° C. to obtain an adhesive film of 25 µm in thickness.

TABLE 1

| Raw material composition of the adhesive | | |
| --- | --- | --- |
| Trade Designation | Material | |
| YP50S | Phenoxy resin | 30 |
| DER332 | Epoxy resin | 34 |
| G-402 | Polycaprolactone modified epoxy resin | 30 |
| EXL-2314 | Particles of acrylic polymer | 80 |
| DICY | Dicyandiamide | 2.9 |
| MeOH | Methanol | 40 |
| THF | Tetrahydrofuran | 550 |
| MC600 | Melamine/isocyanuric acid adduct | 20 |

Phenoxy resin: YP50S, manufactured by Tohto Kasei Co., number averaged molecular weight: 11,800.
Epoxy resin: DER 332, manufactured by Dow Chemical Japan Co., epoxy equivalent of 174
Polycaprolactone modified epoxy resin: PLACCEL G402, manufacture by DAICEL Chemical Industries Co., epoxy equivalent of 1350.
Acrylic particles having glycidyl functional group: EXL 2314, KUREHA PARALOID EXL, manufactured by Kureha Chemical Industry Co.
DICY: dicyandiamide: CG-NA, manufactured by PTI Japan Co. Melamine/isocyanuric acid adduct: MC-600, manufactured by Nissan Chemical Industries Co.

4. Lamination of Adhesive Film

The adhesive was placed on the surface of the circuit of FPC after protrusions were formed, and was laminated with a hot press at 120° C.

5. Resin Sealed Electrical Connection

FPC prepared above with adhesive laminated thereon was connected to aforementioned PCB under the load of 20 kg in accordance with the following temperature schedule.

Held at a temperature of 175° C. or higher for 5 seconds

Maximum temperature of 200° C.

Applied load was released with a heater at 145° C.

6. Result of Measurement of Connection Resistance

Value of connection resistance between PCB and FPC circuits was measured by four terminal method using a milliohmmeter. It was confirmed that the substrate and all the circuits of FPC were connected with resistance of 1Ω or less, and that the connection had the environmental resistance under following conditions. This value includes wiring resistance beyond the four terminal measurement. Results are shown in Table 2 below.

TABLE 2

Value of resistance before and after environmental test (Ω)

| Initial value | After heat cycle[1] | Initial value | After hygro-thermal aging[2] |
|---|---|---|---|
| 0.090 | 0.091 | 0.091 | 0.091 |

[1] Heat cycle: −40° C./30 minutes <−> 80° C./30 minutes, 500 cycles
[2] Hygro-thermal aging: 60° C./90% RH, 500 hours 7. Simple Disconnection Force was applied while heating on a heater at 150° C. to the electrical connection formed by the method as described above. With this method, the connection could be released without causing any damage to PCB or FPC.

8. Repair Performance

The resin sealing connection as described before was again performed on the electrical connection released with the above-described method, and connection resistance was measured to obtain following results. No change was observed in the resistance values after re-connection, and thus good repair performance was confirmed.

TABLE 3

Value of resistance before and after repair

| Initial value | When connected again after disconnection |
|---|---|
| 0.089 | 0.088 |

Prophetic Example

| Designation | Material | Loading | Source |
|---|---|---|---|
| YP50S | Phenoxy resin | 30 | Toto Kasei K.K. |
| DER332 | Epoxy resin | 34 | Dow Chemical |
| G-402 | Polycaprolactone-modified epoxy resin | 30 | Daicel |
| EXL-2314 | Acrylic polymer particles | 80 | Kureha Chemical |
| DICY | dicyandiamide | 2.9 | PTI Japan |
| MC600 | Melamine/isocyanuric acid complex | 20 | Nissan Chemical |
| THF | tetrahydrofuran | 550 | |
| MeOH | methanol | 40 | |

The above materials are stirred until there is a uniform mixture of the components. To this mixture is added an amount of conductive particles (e.g., JCI 7GNM-Ni Au-coated nickel particles) sufficient to give conductivity only in the Z-direction of a dried film of the above adhesive. This amount will vary depending on the conductive particle chosen and the thickness of the resulting film (a typical thickness for the dried film is in the 40-80 microns range). To make the film, the adhesive mixture is coated onto a suitable release liner in an amount that is sufficient to give the desired dried film thickness. The resulting coated backing is then dried for 30 minutes at 100° C. The adhesive film can be heat-treated for 1-2 hours at 150° C. to lightly crosslink it. An important characteristic of the resulting material is that it behaves as a solid below a characteristic yield stress and a fluid above it. Bonding with the film is conducted with sufficient heat and pressure to cause the adhesive to flow. The conductive particles dispersed in the adhesive can contact the adherents under such bonding conditions. Re-work is accomplished by re-heating the bonded parts to a temperature that is sufficient to soften the adhesive so the parts can be easily separated.

It will be appreciated by those of skill in the art that, in light of the present disclosure, changes may be made to the embodiments disclosed herein without departing from the spirit and scope of the present invention.

The invention claimed is:

1. An article comprising:
   a flexible substrate having at least one conductive trace on its surface extending from a first end to a second end of the substrate, wherein said at least one conductive trace is configured to form an electrical connection between a first circuit to be connected at the first end of the substrate and a second circuit to be connected at the second end of the substrate, wherein one or both of the first and second ends of the at least one conductive trace are embossed; and
   a heat-curable adhesive on the first and second ends of the substrate wherein the adhesive comprises conductive particles.

2. An article of claim 1 further comprising a first circuit attached to the first end of the flexible substrate by the heat-curable adhesive and, optionally, a second circuit attached to the second end of the flexible substrate by the heat-curable adhesive.

3. An article of claim 2 wherein at least one of the first and second circuits forms a portion of a device.

4. An article according to claim 1 wherein one or both of the first and second ends of the substrate each have multiple traces.

5. An article according to claim 1 wherein the heat-curable adhesive has a crystalline phase at room temperature.

6. An article according to claim 1 wherein the adhesive is an anisotropically conductive film.

7. An article according to claim 1 wherein the heat-curable adhesive is one or both of removable and reworkable.

8. An article according to claim 1, wherein said heat curable adhesive composition further contains a tack-reducing agent, the tack-reducing agent optionally comprises a melamine/isocyanuric acid adduct.

9. An article according to claim 1 wherein the heat-curable adhesive comprises a foam suppressant.

10. An article according to claim 1 wherein said heat-curable adhesive further comprises a phenoxy resin.

11. An article or method according to claim 10 wherein said heat-curable adhesive further comprises a second epoxy.

12. An electronic article comprising the article of claim 1.

13. An article of claim 12 wherein the electronic article is a flexible circuit or a printed circuit board.

* * * * *